US009837559B2

(12) United States Patent
Lu et al.

(10) Patent No.: US 9,837,559 B2
(45) Date of Patent: Dec. 5, 2017

(54) SOLDERING SYSTEM

(71) Applicant: China Sunergy (Nanjing) Co. Ltd., Jiangsu (CN)

(72) Inventors: Jun Lu, Jiangsu (CN); Jiyuan Zhang, Jiangsu (CN); Thowphock Chua, Jiangsu (CN); Jilei Wang, Jiangsu (CN); Aihua Wang, Jiangsu (CN); Jianhua Zhao, Jiangsu (CN)

(73) Assignee: China Sunergy (Nanjing) Co. Ltd., Nanjing (CN)

( * ) Notice: Subject to any disclaimer, the term of this patent is extended or adjusted under 35 U.S.C. 154(b) by 0 days.

(21) Appl. No.: 14/775,889

(22) PCT Filed: Mar. 13, 2013

(86) PCT No.: PCT/CN2013/072527
§ 371 (c)(1),
(2) Date: Sep. 14, 2015

(87) PCT Pub. No.: WO2014/139099
PCT Pub. Date: Sep. 18, 2014

(65) Prior Publication Data
US 2016/0027933 A1    Jan. 28, 2016

(51) Int. Cl.
| | |
|---|---|
| *B23K 31/02* | (2006.01) |
| *H01L 31/02* | (2006.01) |
| *B23K 1/012* | (2006.01) |
| *B23K 1/00* | (2006.01) |
| *B23K 1/008* | (2006.01) |
| *B23K 1/19* | (2006.01) |
| *B23K 3/047* | (2006.01) |
| *B23K 3/08* | (2006.01) |

(Continued)

(52) U.S. Cl.
CPC .......... *H01L 31/0201* (2013.01); *B23K 1/008* (2013.01); *B23K 1/0016* (2013.01);
(Continued)

(58) Field of Classification Search
CPC .......... B23K 1/0016; B23K 2201/36–2201/42; B23K 1/012; B23K 3/04; B23K 1/008;
(Continued)

(56) References Cited

U.S. PATENT DOCUMENTS

| | | | | |
|---|---|---|---|---|
| 4,775,775 A | * | 10/1988 | Spigarelli | G05D 23/1934 219/508 |
| 5,178,685 A | * | 1/1993 | Borenstein | H01L 31/022425 136/244 |

(Continued)

FOREIGN PATENT DOCUMENTS

| | | |
|---|---|---|
| CN | 2663069 | 12/2004 |
| CN | 1758094 | 4/2006 |

(Continued)

OTHER PUBLICATIONS

Machine translation of JP-2006-278699A (no date available).*
(Continued)

*Primary Examiner* — Kiley Stoner
(74) *Attorney, Agent, or Firm* — Fish & Richardson P.C.

(57) ABSTRACT

This disclosure relates to a soldering system containing a soldering apparatus and a heating apparatus. The soldering apparatus includes a heating plate having a body defining a plurality of first air exits, each first air exit extending through the body of the heating plate and the heating plate being configured to supply hot air through the first air exits; a cover disposed on the heating plate, the cover and the heating plate defining a hot air chamber; a plurality of axially movable positioning shafts extending though the body of the heating plate, in which each shaft has a first end and a second end, the first end is in the hot air chamber, and the second end is outside the hot air chamber; and a conduit attached to the cover, the conduit being configured to supply hot air to the hot air chamber.

4 Claims, 3 Drawing Sheets

(51) Int. Cl.
*H05K 3/34* (2006.01)
*H01L 31/18* (2006.01)
*B23K 3/04* (2006.01)
*F24H 3/08* (2006.01)
*B23K 101/40* (2006.01)

(52) U.S. Cl.
CPC .............. *B23K 1/012* (2013.01); *B23K 1/19* (2013.01); *B23K 3/04* (2013.01); *B23K 3/0473* (2013.01); *B23K 3/08* (2013.01); *F24H 3/081* (2013.01); *H01L 31/188* (2013.01); *H05K 3/3478* (2013.01); *B23K 2201/40* (2013.01); *H05K 3/3494* (2013.01); *H05K 2203/0405* (2013.01); *Y02E 10/50* (2013.01)

(58) Field of Classification Search
CPC .......... B23K 3/0473; B23K 1/19; B23K 3/08; H01L 31/0201; H01L 31/188; F24H 3/081; H05K 3/3478; H05K 3/3494; H05K 2203/0405; Y02E 10/50
USPC ....... 228/179.1–180.22, 233.2, 42, 218–220, 228/57; 392/482
See application file for complete search history.

(56) References Cited

U.S. PATENT DOCUMENTS

| | | | | |
|---|---|---|---|---|
| 5,296,680 A * | 3/1994 | Yamada | .................. | B23K 1/008 219/388 |
| 5,338,008 A * | 8/1994 | Okuno | .................. | H05K 3/3494 266/105 |
| 5,364,007 A * | 11/1994 | Jacobs | .................. | B23K 3/0646 219/390 |
| 5,405,074 A * | 4/1995 | Den Dopper | .......... | B23K 1/008 219/388 |
| 5,440,101 A * | 8/1995 | Cox | ....................... | B23K 1/008 219/388 |
| 5,785,237 A * | 7/1998 | Lasto | .................... | B23K 1/012 228/180.22 |
| 6,121,542 A * | 9/2000 | Shiotsuka | ....... | H01L 31/022425 136/256 |
| 6,386,422 B1 * | 5/2002 | Cheng | .................... | B23K 1/008 228/46 |
| 6,503,336 B1 | 1/2003 | Barr | | |
| 8,113,190 B2 * | 2/2012 | Dougherty | ............. | A21B 1/245 126/15 A |
| 9,485,872 B2 * | 11/2016 | Hiyama | ................. | B23K 1/008 |
| 2001/0055740 A1 * | 12/2001 | Bloom | .................... | B23K 1/008 432/247 |
| 2002/0020695 A1 * | 2/2002 | Yokota | ................... | B23K 1/008 219/388 |
| 2002/0073574 A1 * | 6/2002 | Durdag | ................ | B23K 1/0016 34/201 |
| 2002/0139007 A1 * | 10/2002 | Yoshida | ................. | F26B 3/283 34/624 |
| 2004/0063058 A1 * | 4/2004 | Orbeck | ................. | B23K 1/008 432/128 |
| 2005/0178814 A1 * | 8/2005 | Yokota | ..................... | B23K 3/04 228/43 |
| 2005/0201069 A1 | 9/2005 | Kirigaya | | |
| 2006/0021703 A1 * | 2/2006 | Umotoy | ............ | C23C 16/45565 156/345.34 |
| 2007/0095387 A1 * | 5/2007 | Fujii | .................... | H01L 31/0512 136/251 |
| 2007/0235077 A1 * | 10/2007 | Nagata | ............. | B32B 17/10018 136/256 |
| 2008/0202584 A1 * | 8/2008 | Basol | ................ | H01L 31/03928 136/262 |
| 2009/0032109 A1 * | 2/2009 | Kushiya | ............ | H01L 31/0322 136/264 |
| 2009/0134142 A1 * | 5/2009 | Nakamura | .............. | B23K 1/008 219/420 |
| 2009/0266399 A1 * | 10/2009 | Basol | .................. | H01L 31/0322 136/244 |
| 2009/0269877 A1 * | 10/2009 | Pinarbasi | ............ | H01L 31/0322 438/98 |
| 2010/0043860 A1 * | 2/2010 | Morita | .................. | H01L 31/188 136/244 |
| 2010/0116325 A1 * | 5/2010 | Nikoonahad | ....... | H01L 27/1421 136/251 |
| 2010/0163106 A1 * | 7/2010 | Tachibana | ......... | H01L 31/03921 136/256 |
| 2010/0200058 A1 * | 8/2010 | Funakoshi | ............ | H01L 31/048 136/256 |
| 2011/0139225 A1 * | 6/2011 | Boydell | ................ | H01L 31/048 136/251 |
| 2011/0239450 A1 * | 10/2011 | Basol | ...................... | B32B 37/22 29/738 |
| 2011/0315746 A1 * | 12/2011 | Dautenhahn | ......... | B23K 1/0016 228/234.1 |
| 2012/0178039 A1 * | 7/2012 | Kagaya | ................ | B23K 1/0016 432/219 |
| 2012/0235268 A1 * | 9/2012 | Niira | ..................... | H01L 31/048 257/432 |
| 2013/0048047 A1 * | 2/2013 | Fujii | .................... | H01L 31/0504 136/244 |
| 2013/0112234 A1 * | 5/2013 | Ishii | ................ | H01L 31/022425 136/244 |
| 2013/0186461 A1 * | 7/2013 | Kim | .................... | H01L 31/0201 136/256 |
| 2013/0305528 A1 * | 11/2013 | Anderson | ............. | H02J 7/0052 29/825 |
| 2014/0124013 A1 * | 5/2014 | Morad | ................ | H01L 31/0504 136/246 |
| 2014/0124014 A1 * | 5/2014 | Morad | .................. | H01L 31/042 136/246 |
| 2014/0196768 A1 * | 7/2014 | Heng | ................... | H01L 31/0504 136/251 |
| 2014/0202528 A1 * | 7/2014 | Yang | ................ | B32B 17/10036 136/256 |
| 2014/0252607 A1 * | 9/2014 | Miyauchi | ................ | H01L 24/81 257/737 |
| 2014/0261636 A1 * | 9/2014 | Anderson | ............. | H02J 7/0042 136/251 |
| 2014/0283900 A1 * | 9/2014 | Umemoto | ........... | H01L 31/0488 136/251 |
| 2015/0173209 A1 * | 6/2015 | Dhavaleswarapu | ... | B23K 3/085 228/194 |
| 2016/0027932 A1 * | 1/2016 | Lu | ....................... | H01L 31/0201 136/244 |
| 2016/0027933 A1 * | 1/2016 | Lu | .......................... | B23K 1/012 228/180.21 |
| 2016/0163910 A1 * | 6/2016 | Gonzalez | ............. | H01L 31/0504 438/80 |

FOREIGN PATENT DOCUMENTS

| | | |
|---|---|---|
| CN | 101185170 | 5/2008 |
| CN | 201201085 | 3/2009 |
| CN | 102076178 | 5/2011 |
| CN | 102896395 | 1/2013 |
| DE | 4422341 | 1/1996 |
| EP | 1887633 | 2/2008 |
| JP | 58-34937 | 3/1983 |
| JP | 2003-332725 A * | 11/2003 |
| JP | 2006108527 | 4/2006 |
| JP | 2006-278699 A * | 10/2012 |

OTHER PUBLICATIONS

International Search Report and Written Opinion in International Application No. PCT/CN2013/072527, dated Dec. 19, 2013, 12 pages.

* cited by examiner

SOLDERING SYSTEM

CROSS REFERENCE TO RELATED APPLICATION

This is a U.S. National Phase application under 35 U.S.C. §371 of International Patent Application No. PCT/CN2013/072527, filed Mar. 13, 2013, the contents of which are incorporated herein by reference.

TECHNICAL FIELD

This disclosure relates to soldering systems, as well as related components, apparatuses, and methods.

BACKGROUND

Solar cells (also known as photovoltaic cells) convert light into electrical energy. In general, a solar cell has a photoelectric conversion layer that, upon exposure to light, generates charge carriers, such as electrons. Electrodes in the solar cell conduct these electrons to an external device, thereby producing an electrical current.

One common solar cell technology collects the charge carriers by forming a plurality of electrically conductive fingers on the photoelectric conversion layer. These fingers conduct the collected charge carriers to a bus bar, which has a large surface for electrically connecting the fingers to an external device. In general, the electrically conductive fingers and the bus bar form an electrode on the photoelectric conversion layer.

Typically, electrodes in a solar cell are electrically connected to the electrodes in other solar cells to form a solar module. These electrically connections are ordinarily achieved by using a soldering process to attach ribbons (e.g., flat copper wires) to the electrodes of a solar cell.

SUMMARY

This disclosure is in part based on the unexpected discovery that a solder apparatus that provides heat through air exits in a heating plate can provide relatively uniform heating to a solar cell, can significantly improve soldering speed and heating efficiency, and can be easily modified to attach ribbons to different types of solar cells. In addition, this disclosure is in part based on the unexpected discovery that a heating apparatus having grooves that heat ribbons and bus bars locally during a soldering process can reduce damage to the solar cell while reducing energy consumption and improving soldering speed.

In one aspect, this disclosure features a soldering apparatus that includes a heating plate having a body defining a plurality of first air exits, each first air exit extending through the body of the heating plate and the heating plate being configured to supply hot air through the first air exits; a cover disposed on the heating plate, the cover and the heating plate defining a hot air chamber; a plurality of axially movable positioning shafts extending though the body of the heating plate, in which each shaft has a first end and a second end, the first end is in the hot air chamber, and the second end is outside the hot air chamber; and a conduit attached to the cover, the conduit being configured to supply hot air to the hot air chamber.

In another aspect, this disclosure features a method for manufacturing a solar cell that includes disposing a ribbon onto a bus bar in an article containing a photoelectric conversion layer and the bus bar, the bus bar being disposed on the photoelectric conversion layer; and soldering the ribbon to the bus bar to form a solar cell. The soldering includes directing hot air simultaneously to the ribbon and to the photoelectric conversion layer not covered by the ribbon.

In still another aspect, this disclosure features a heating apparatus that includes a body defining a plurality of elongated grooves on a surface and a plurality of first channels, each of the first channels being beneath one of the grooves; and a plurality of heating element configured to heat the grooves, each heating element being disposed in one of the first channels.

Embodiments can include one or more of the following features.

In some embodiments, each first air exit is configured as a hole extending through the body of the heating plate. In some embodiments, each first air exit is configured as a linear channel extending across a surface of the heating plate and through the body of the heating plate.

In some embodiments, each axially movable positioning shaft is disposed between two neighboring first air exits. In some embodiments, the two neighboring first air exits are configured to direct hot air toward the second end of the axially movable positioning shaft disposed between the two neighboring first air exits. In such embodiments, each of the two neighboring first air exits can be configured to form an angle ranging from about 5° to about 60° with the axially movable positioning shaft disposed between the two neighboring first air exits.

In some embodiments, the axially movable positioning shafts are arranged in a plurality of lines on the heating plate, each line including a plurality of axially movable positioning shafts.

In some embodiments, the heating plate further defines a plurality of second air exits between two lines of axially movable positioning shafts, each second air exit extending through the body of the heating plate. In such embodiments, each second air exits can be configured to be substantially parallel to an axially movable positioning shaft.

In some embodiments, the axially movable positioning shafts form from 4 to 12 lines on the heating plate, each line being configured to correspond to a bus bar in a solar cell. In some embodiments, each line includes from 4 to 14 axially movable positioning shafts.

In some embodiments, each axially movable positioning shaft defines a groove at the second end, the groove being configured to receive a ribbon to be soldered onto a bus bar in a solar cell.

In some embodiments, each axially movable positioning shaft is configured to affix a ribbon to a bus bar in a solar cell during use.

In some embodiments, the hot air has a temperature ranging from about 100° C. to about 300° C.

In some embodiments, the hot air is directed to the ribbon and at least a portion of the photoelectric conversion layer not covered by the ribbon through a plurality air exits defined by a plate.

In some embodiments, each air exit for directing the hot air to the ribbon is configured to form an angle ranging from about 5° to about 60° with a vertical axis of the plate.

In some embodiments, each air exit for directing the hot air to at least a portion of the photoelectric conversion layer not covered by the ribbon is generally parallel to the vertical axis of the plate.

In some embodiments, the grooves in the heating apparatus have an average width ranging from about 0.05 mm to about 3 mm and/or have an average depth ranging from about 0.1 mm to about 3 mm.

In some embodiments, the heating apparatus further includes a plurality of thermocouples connected to an electrical control system, each thermocouple being disposed between a heating element and a groove, and each thermocouple being configured to control the temperature of a heating element.

In some embodiments, the body in the heating apparatus further defines a plurality of second channels, each of the second channels is between a first channel and a groove, and each thermocouple is disposed in each of the second channels.

Other features, objects, and advantages will be apparent from the description, drawings, and claims.

DESCRIPTION OF DRAWINGS

Like reference symbols in the various drawings indicate like elements.

DETAILED DESCRIPTION

In general, this disclosure relates to soldering systems, as well as related components, apparatuses, and methods.

Figure 1:
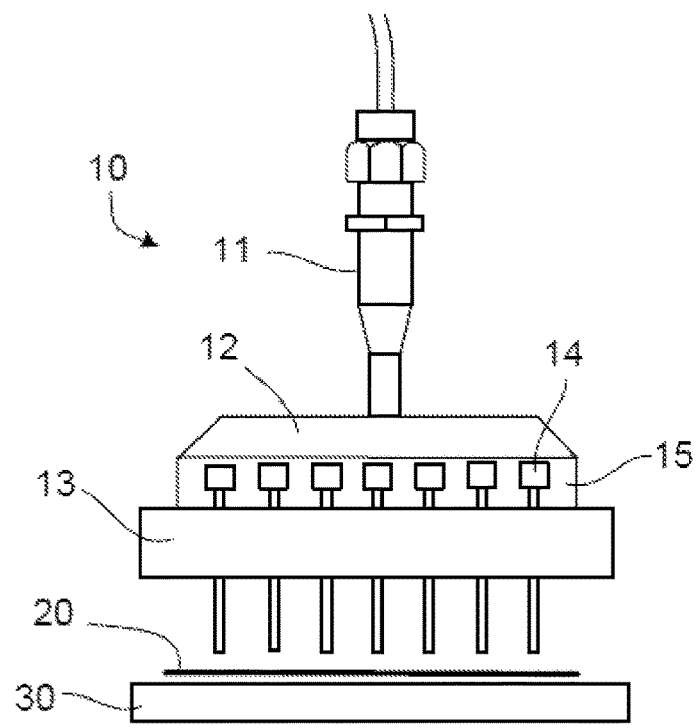
FIG. 1 is a perspective view of a soldering system using an exemplary soldering apparatus and an exemplary heating apparatus to solder ribbons onto a solar cell article.

FIG. 1 is a perspective view of a soldering system using an exemplary soldering apparatus 10 and an exemplary heating apparatus 30 to solder ribbons (not shown in FIG. 1) onto a solar cell article 20. The soldering system includes a conduit 11, a cover 12, a heating plate 13, and a plurality of axially movable positioning shafts 14. Heating plate 13 includes a body defining a plurality of air exits (not shown in FIG. 1) through which hot air can reach and heat solar cell article 20 during a soldering process. Cover 12 is disposed on heating plate 13 and, together with heating plate 13, defines a hot air chamber 15. Each of axially movable positioning shafts 14 extends though the body of heating plate 13. Each shaft 14 has two ends, one of which is in hot air chamber 15 and the other is outside hot air chamber 15. During use, axially movable positioning shafts 14 can press ribbons against bus bars on a solar cell article to facilitate the soldering of ribbons onto the bus bars. Conduit 11 is attached to cover 12 and is configured to supply hot air to hot air chamber 15 during a soldering process.

Figure 2:
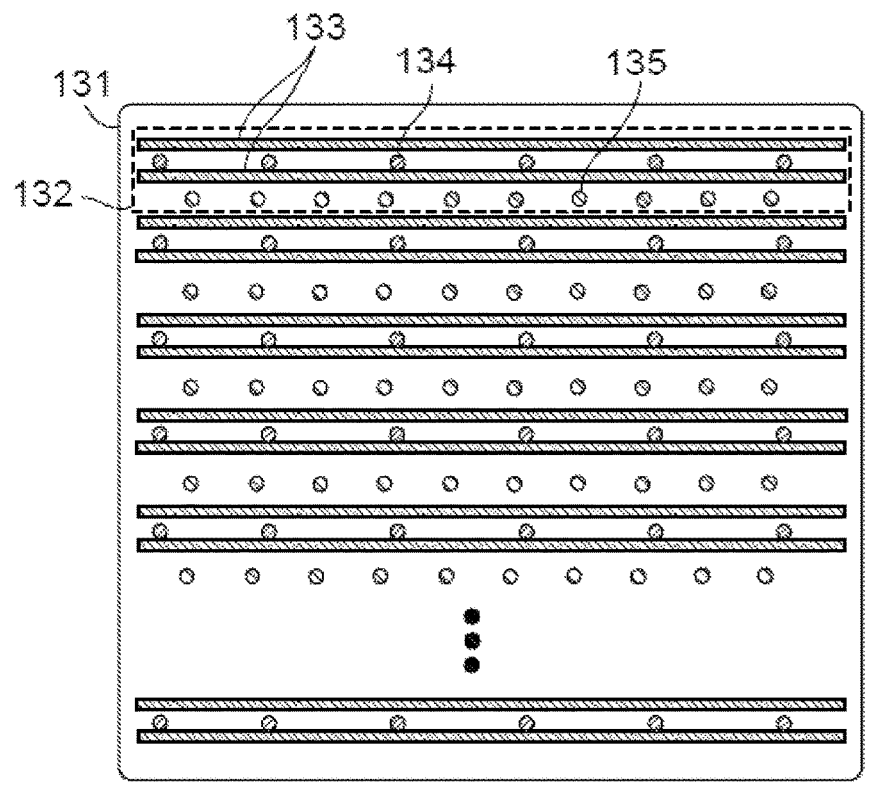
FIG. 2 is a top view of the heating plate in the soldering apparatus shown in FIG. 1.

FIG. 2 is a top view of heating plate 13 in soldering apparatus 10 shown in FIG. 1. As shown in FIG. 2, heating plate 13 includes a body 131 that includes a plurality of heating units 132. Each heating unit 132 defines two neighboring first air exits 133, a plurality of holes 134 between two neighboring first air exits 133, and a plurality of second air exits 135. Each holes 134 can be configured to receive an axially movable positioning shaft 14 such that shaft 14 can move up and down in hole 134 during a soldering process. In some embodiments, second air exits 135 can be located between a first air exit 133 in one heating unit 132 and a first air exit 133 in a neighboring heating unit 132.

In general, during a soldering process, first and second air exits 133 and 135 allows hot air to pass through to heat ribbons on a solar cell article such that the ribbons are soldered to and cover bus bars on the solar cell article. First and second air exits 133 and 135 can generally be configured to have any suitable shape. In some embodiments, each of first and second air exits 133 and 135, independently, can be configured as a hole extending through body 131 of heating plate 13. In some embodiments, each of first and second air exits 133 and 135, independently, can be configured as a linear channel extending across a surface of heating plate 13 and through body 131 of heating plate 13. In some embodiments, as shown in FIG. 2, each first air exit 133 can be configured as a linear channel extending across a surface of heating plate 13 and through body 131 of heating plate 13, while each second air exit 135 can be configured as a hole extending through body 131 of heating plate 13.

Figure 3:
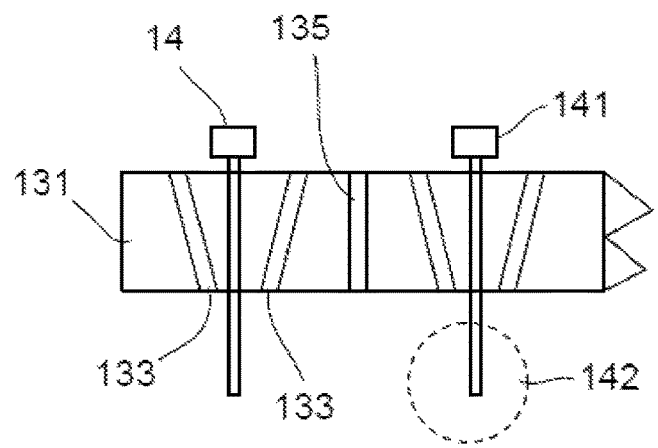
FIG. 3 is a cross-sectional view of the heating plate in the soldering apparatus shown in FIG. 1.

In some embodiments, two neighboring first air exits 133 in a heating unit 132 are configured to direct hot air toward the end of axially movable positioning shaft 14 that is outside hot air chamber 15 during use. FIG. 3 is a cross-sectional view of heating plate 13 in soldering apparatus 10 shown in FIG. 1 showing a cross-section vertical to solar cell article 20. As shown in FIG. 3, axially movable positioning shaft 14 has a first end 141 and a second end 142 on opposite sides of body 131 of heating plate 13. In some embodiments, first end 141 can be located inside hot air chamber 15 (not shown in FIG. 3) and second end 142 can be located outside hot air chamber 15. Two neighboring air exits 133 are configured to direct hot air toward second end 142 of an axially movable positioning shaft 14.

In some embodiment, as shown in FIG. 3, each of the two neighboring first air exits 133 is configured to form a suitable angle with an axially movable positioning shaft 14 to facilitate directing hot air toward second end 142. For example, the angle can be at least about 5° (e.g., at least about 10°, at least about 15°, at least about 20°, at least about 25°, or at least about)30° and/or at most about 60° (e.g., at most about 55°, at most about 50°, at most about 45°, at most about 40°, or at most about 35°).

Without wishing to be bound by theory, it is believed that using first air exits 133 to direct hot air to second end 142 of an axially movable positioning shaft 14 can allow hot air be concentrated on ribbons to be soldered onto bus bars in a solar cell article, thereby greatly improving soldering speed and heating efficiency.

In some embodiments, as shown in FIGS. 2 and 3, second air exits 135 can be located between axially movable positioning shafts 14 in one heating unit 132 and axially movable positioning shafts 14 in a neighboring heating unit 132 (or between a first air exit 133 in one hearing unit 132 and a neighboring first air exit 133 in a neighboring heating unit 132). In some embodiments, each second air exit 135 is substantially parallel to an axially movable positioning shaft 14. In such embodiments, an axially movable positioning shaft 14 can be substantially parallel to a vertical axis of heating plate 13 such that each second air exit 135 is also substantially parallel to a vertical axis of heating plate 13.

In general, second air exits 135 in heating plate 13 are configured to direct hot air to at least a portion of a solar cell (e.g., at least a portion of a photoelectric conversion layer) that is not covered by ribbons during a soldering process. By contrast, a conventional soldering apparatus typically only heats areas covered by ribbons. When the photoelectric conversion layer is made from a silicon wafer that has a relatively large thermal conductivity, a soldering process using a conventional soldering apparatus can be inefficient due to the large heat diffusion from the hot ribbon-covered areas to cold areas not covered by ribbons. Without wishing to be bound by theory, it is believed that using second air exits 135 to direct hot air to a portion of a solar cell that is not covered by ribbons during a soldering process can reduce temperature differences between different areas in a solar cell (e.g., between areas covered by ribbons and areas not covered by ribbons), thereby reducing heat transfers between these areas and improving soldering efficiency and speed. For example, during a soldering process, hot air passing through first air exits 133 and second air exits 135 can heat ribbons (as well as the bus bars covered by the ribbons) to a temperature of from about 180° C. to about 200° C. and heat areas not covered by ribbons to from about 140° C. to about 160° C., resulting in a relative smaller temperature difference between different areas in a solar cell. In addition, without wishing to be bound by theory, it is believed that using heating plate 13 having first air exits 133 and second air exits 135 can allow hot air to be simultaneously directed to ribbons and at least a portion of a solar cell (e.g., at least a portion of a photoelectric conversion layer) that is not covered by ribbons, thereby reducing damage to the solar cell caused by non-uniform heating (e.g., heating ribbons only) during the soldering process and improving soldering quality and speed.

A conventional soldering apparatus generally provides a plurality of hot air pipes to supply hot air to solder ribbons onto the bus bars of a solar cell article. When the solar cell article include a relatively large number of bus bars (e.g., from 4-12 bus bars), it is difficult to increase the number of hot air pipes to solder ribbons onto these bus bars. Without wishing to be bound by theory, it is believed that an advantage of soldering apparatus 10 described herein (which supplies heat through air exits 133 and 135) is that the configuration of air exits 133 and 135 can be easily adjusted (e.g., by adding more air exits or adjusting the distances between air exits) to accommodate the increasing number of bus bars in a solar cell article.

In general, each heating unit 132 can include a plurality of axially movable positioning shafts 14, each of which extends through a hole 134 in body 131 of heating plate 13. In some embodiments, axially movable positioning shafts 14 can be made from a thermal insulating material, such as a ceramic material.

In some embodiments, axially movable positioning shafts 14 can be arranged along a line on heating plate 13 such that all axially movable positioning shafts 14 in a heating unit 132 are disposed between two neighboring first exits 133. In such embodiments, during use, axially movable positioning shafts 14 in a heating unit 132 can press a ribbon against a bus bar on a solar cell such that two neighboring first exits 133 in the heating unit 132 can direct hot air toward that ribbon to solder it onto the bus bar. For example, each axially movable positioning shaft 14 can have a protrusion at the upper portion (e.g., near first end 141), the bottom end of which can be connected to one end of a spring (not shown in FIGS. 1-3). The other end of the spring can be connected to the surface on heating plate 13 facing cover 12. During use, when heating plate is lowered such that an axially movable positioning shaft 14 contacts and presses against a ribbon, the spring can resist the downward force to create a soft touch between the shaft and the ribbon.

In general, each heating unit 132 can have any suitable number of axially movable positioning shafts 14. In some embodiments, heating unit 132 can have from 4 to 14 (i.e., any integer from 4 to 14) axially movable positioning shafts 14. Without wishing to be bound by theory, it is believed that, if a heating unit 132 does not have enough axially movable positioning shafts 14 (e.g., less than 4 shafts), a ribbon may not be uniformly pressed against a bus bar over its entire length such that soldering strength in certain areas of the ribbon may be relatively low. On the other hand, in general, the contact points between a ribbon and shafts 14 have relatively low soldering quality as shafts 14 themselves are not heated and generally have a lower temperature than heated ribbon areas during a soldering process. Thus, without wishing to be bound by theory, it is believed that, if a heating unit 132 has too many axially movable positioning shafts 14 (e.g., more than 14 shafts), overall ribbon soldering quality may be relatively low as there are too many contact points between a ribbon and shafts 14.

In some embodiment, an axially movable positioning shaft 14 can have a groove at second end 142. The groove can be configured receive a ribbon to be soldered onto a bus bar in a solar cell. For example, the groove can have a width slightly larger than that of a ribbon such that the ribbon can be fitted into the groove and a depth slightly smaller than that of a ribbon so that a portion of the ribbon protrudes from the groove to facilitate soldering. Without wishing to be bound by theory, it is believed that such a groove can facilitate affixing a ribbon at a desired location (e.g., on a bus bar) and minimize shifting of the ribbon during a soldering process, thereby improving soldering quality and speed.

In general, the number of heating units 132 on heating plate 13 corresponds to the number of bus bars on a solar cell to which ribbons are to be attached. For example, when the solar cell contains 2-12 bus bars, the number of heating units 132 on heating plate 13 can be 2-12, respectively. In some embodiments, the number of heating units 132 on heating plate can be any integer within the range of 4 to 12.

In some embodiments, heating plate 13 can be formed from a thermal insulating material, such as a composite material (e.g., a polymer composite material) or a ceramic material. In some embodiments, heating plate 13 can have a high thermal resistance. For example, in some embodiments, heating plate 13 does not melt at the temperature (e.g., 100-300° C.) used during a soldering process. In some embodiments, heating plate 13 can be formed from a thermal conducting material, such as a metal (e.g., copper, aluminum, or a metal alloy). In such embodiments, heating plate 13 can be coated with a thermal insulating material.

In general, cover 12 and heating plate 13 form hot air chamber 15. A conduit 11 can be attached to cover 12 and configured to supply hot air to hot air chamber 15. For example, conduit 11 can have one end connected to a hot air supply (e.g., a system including a heating source for heating the air and a fan for blowing the heated air) and the other end connected to an opening on cover 12. In some embodiments, conduit 11 and cover 12 can include heating elements (e.g., electric heating wires) to heat or maintain the temperature of the hot air passing through these two components. In some embodiments, conduit can include a valve (not shown in FIG. 1) that can adjust the supply of hot air to hot air chamber 15 during a soldering process.

In some embodiments, soldering apparatus 10 can have one hot air chamber 15 formed by cover 12 and heating plate 13. In some embodiments, soldering apparatus 10 can have a plurality of covers 12 disposed on heating plate 13, each of which forms a hot air chamber 15 with heating plate 13. In such embodiments, each cover 12 can be connected to a hot air supply through a conduit 11. In some embodiments, each cover 12 can be connected to more than one (e.g., two, three or four) conduit 11. In some embodiments, each conduit 11 can be connected to one or more (e.g., two, three, or four) hot air supplies. In other embodiments, multiple conduits 11 can be connected to one hot air supply. In some embodiments, cover 12 and conduit 11 can be made from the same materials that are used to make heating plate 13.

Figure 5:
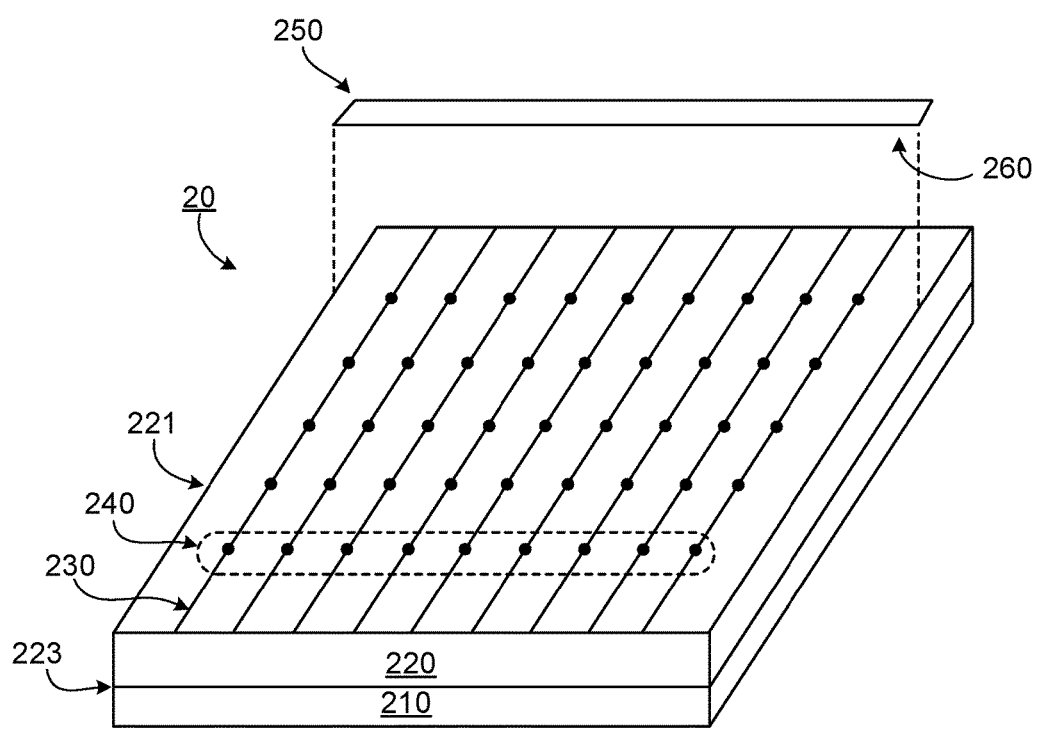
FIG. 5 is a perspective view of an exemplary solar cell made by the soldering system shown in FIG. 1.

In general, soldering apparatus 10 shown in FIG. 1 can be used to manufacture any suitable solar cell (e.g., a monocyrstalline or polycrystalline silicon solar cell) by soldering ribbons onto bus bars in solar cell article 20. In some embodiments, as shown in FIG. 5, solar cell article 20 can include a back electrode 210, a photoelectric conversion layer 220, a plurality of electrically conductive fingers 230, a plurality of bus bars (e.g., any number of bus bars within the range of 2-12) 240. The photoelectric conversion layer 220 can have a front surface 221 and a back surface 223. The back electrode 210 can be disposed on the back surface 223 of the photoelectric conversion layer 220. The electrically conductive fingers 230 can be disposed on the front surface 221 of the photoelectric conversion layer 220 and can be substantially parallel to each other. The bus bars 240 can be disposed on the front surface 221 of the photoelectric conversion layer 220 and can be electrically connected to the fingers 230. During a soldering process, a plurality of ribbons 250 can be soldered onto and cover the bus bars 240 such that each ribbon 250 is electrically connected to a bus bar 240 to form complete solar cell. In a continuous manufacturing process, soldering apparatus 10 can solder ribbons onto a plurality of solar cell article 20 simultaneously or sequentially, thereby forming a solar module that includes solar cells electrically interconnected with each other through ribbons.

In general, the photoelectric conversion layer in solar cell article 20 can be formed from any suitable material. In some embodiments, the materials that can be used to form the photoelectric conversion layer can include inorganic semiconductor materials or organic semiconductor materials. Exemplary inorganic semiconductor materials include silicon (e.g., monocrystalline silicon, polycrystalline silicon, or amorphous silicon), copper indium gallium selenide (CIGS), copper indium selenide (CIS), copper gallium selenide (CGS), copper gallium telluride (CGT), copper indium aluminum selenide (CIAS), cadmium selenide (CdSe), and cadmium telluride (CdTe). Exemplary organic semiconductor materials include conjugated polymers (e.g., polythiophenes, polyanilines, polycarbazoles, polyvinylcarbazoles, polyphenylenes, polyphenylvinylenes, polythienylenevinylenes, and copolymers thereof) and fullerenes (e.g., such substituted fullerenes such as [6,6]-phenyl C61-butyric acid methyl ester (PCBM)).

The electrically conductive fingers in solar cell article 20 can generally be a plurality of conductive lines disposed on the front surface of the photoelectric conversion layer. These fingers are generally formed from an electrically conductive material (e.g., a metallic material such as silver).

In general, the bus bars in solar cell article 20 can have any suitable shape and form. The bus bars are generally made from an electrically conductive material (e.g., a metallic material such as silver). Examples of suitable bus bars have been described in commonly-owned co-pending PCT Application No. PCT/CN2013/072359, which is hereby incorporated by reference in its entirety.

In some embodiments, the back electrode can be a homogeneous layer made from an electrically conductive material, such as a metal (e.g., aluminum, silver, or an alloy thereof). In some embodiments, the back electrode can be made from a plurality of electrically conductive fingers electrically connected to a plurality of bus bars (e.g., similar to the electrically conductive fingers and bus bars on the front surface of the photoelectric conversion layer).

In general, solar cell article 20 can be made by methods known in the art. For example, a photoelectric conversion layer (e.g., containing a monocrystalline or polycrystalline silicon layer) can be first formed by doping a p-typed or n-typed silicon wafer (e.g., by injecting or diffusing phosphor into a p-typed silicon wafer or by injecting or diffusing boron into an n-typed silicon wafer). A back electrode (e.g., an aluminum electrode or an electrode containing electrically conductive fingers and bus bars) can be disposed on the back surface of the photoelectric conversion layer. Electrically conductive fingers and bus bars can then be disposed (either simultaneously or sequentially) on the front surface of photoelectric conversion layer, e.g., by screening printing.

Ribbons to be soldered onto solar cell article 20 are generally formed by materials known in the art. For example, as shown in FIG. 5, ribbons can be formed from an electrically conductive material (e.g., copper) that is coated with a solder 260 (e.g., tin). In general, ribbons can be a continuous sheet and can be soldered to solar cell article 20 by using soldering apparatus 10 described herein.

In general, soldering apparatus 10 can be used to attach ribbons on bus bars on the front surface of a solar cell as follows: A plurality of ribbons are first disposed onto solar cell article 20 such that each ribbons covers one of a plurality of bus bars on the front surface of a photoelectric conversion layer. Axially movable positioning shafts 14 in soldering apparatus 10 can then be lowered to press ribbons against the bus bars. The ribbons can then be soldered to the bus bars by directing hot air simultaneously to the ribbons (e.g., through first air exits 133) and to at least a portion of the photoelectric conversion layer not covered by the ribbons (e.g., through second air exits 135). The hot air can heat the ribbons and bus bars at a suitable temperature (e.g., from about 100° C. to about 300° C. such as about 180° C. or 200° C.) for a certain period of time (e.g., from about 0.5 second to about 5 seconds). After the hot air is turned off, soldering apparatus 10 can be removed from the solar cell thus formed. In some embodiments, soldering apparatus 10 can be used to make more than one solar cell (e.g., from 2 to 60 solar cells) simultaneously or sequentially to form a solar module.

In some embodiments, when the back electrode in solar cell article 20 includes bus bars, ribbons can be soldered onto the bus bars in the back electrode by using heating apparatus 30 shown in FIG. 1 to form electrical interconnects of a complete solar cell (which can be used to electrically connect to another solar cell or an external load). In some embodiments, heating apparatus 30 can also be used to solder ribbons onto the bus bars on the front surface of a photoelectrical conversion layer in a solar cell article 20.

Figure 4:
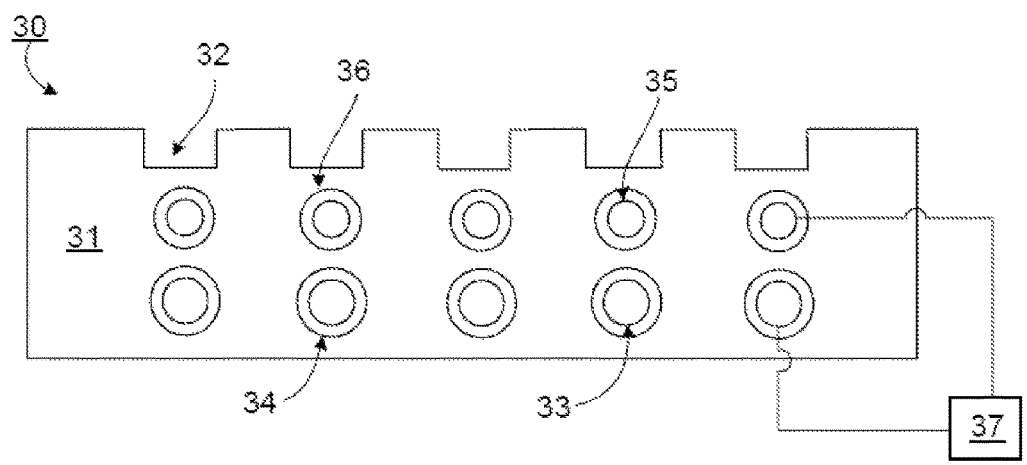
FIG. 4 is a cross-sectional view of the heating apparatus shown in FIG. 1.

FIG. 4 is a cross-sectional view of heating apparatus 30 shown in FIG. 1 showing a cross-section vertical to solar cell article 20. As shown in FIG. 4, heating apparatus 30 includes a body 31 that defines a plurality of elongated grooves 32 on a surface, a plurality of first channels 34, and a plurality of second channels 36. Each of the first channels 34 is located beneath one of the grooves 32 and each of the second channels 36 is located between a corresponding first channel 34 and a corresponding groove 32. Heating apparatus 30 further includes a plurality of heating elements 33 configured to heat grooves 32. Each heating element 33 is disposed in one of the first channels 34. In addition, heating apparatus 30 includes a plurality of thermocouples 35, each of which is disposed in a second channel 36 and is between a groove 32 and a heating element 33. Each thermocouple 35 can be connected to an electrical control system 37 and is configured to control heating of grooves 32 and ribbons in grooves 32 within a certain temperature range. Each heating element 33 can be connected to electrical control system 37 and can be turned on or off by electrical control system 37 in response to a signal from a thermocouple 35. In some embodiments, multiple thermocouples 35 and multiple heating elements 33 can be connected to the same electrical control system 37.

In some embodiments, heating apparatus 30 can have any of 2-12 (e.g., any of 4-12) grooves 32. The number of grooves 32 in heating apparatus 30 is generally identical to the bus bars in the back electrode of solar cell article 20. For example, when solar cell article 20 has five bus bars in the back electrode, heating apparatus 30 can have five grooves 32.

In general, grooves 32 can affix ribbons to desired locations to facilitate soldering ribbons to cover bus bars on a solar cell article. In some embodiments, each groove 32 can have a length substantially identical to a ribbon to be soldered on the bus bars in a back electrode of a solar cell article 20, have a width slightly larger than that of the ribbon so that the ribbon can be fitted into groove 32, and have a depth slightly smaller than that of the ribbon so that a portion of the ribbon protrudes from the groove to facilitate soldering. In some embodiments, grooves 32 can have an average width of at least about 0.05 mm (e.g., at least about 0.1 mm, at least about 0.2 mm, at least about 0.5 mm, or at least about 1 mm) and/or at most about 3 mm (e.g., at most about 2.5 mm, at most about 2 mm, at most about 1.5 mm, or at most about 1 mm). In some embodiments, grooves 32 can have an average depth of at least about 0.05 mm (e.g., at least about 0.1 mm, at least about 0.2 mm, or at least about 0.5 mm) and/or at most about 1 mm (e.g., at most about 0.8 mm, at most about 0.6 mm, at most about 0.5 mm, or at most about 0.4 mm). During use, ribbons can be first placed into grooves 32 and then soldered onto the bus bars in the back electrode of a solar cell article 20.

In general, heating elements 33 are configured to locally heat grooves 32, the ribbons in grooves 32, and bus bars in the back electrode of a solar cell article 20 to a suitable temperature (e.g., from 140° C. to 200° C. such as 160° C. or 180° C.) during a soldering process. Without wishing to be bound by theory, it is believed that using heating apparatus 30 that heats ribbons and bus bars locally through heating elements 33 can significantly improve soldering speed and reduce energy consumption comparing to a conventional hot plate that heats the entire back surface of a solar cell uniformly, while reducing damage to the solar cell caused by the temperature differences caused by a conventional hot plate. Specifically, without wishing to be bound by theory, it is believed that using a conventional hot plate that heats the entire back surface of a solar cell uniformly during a soldering process would cause temperature differences between the front and back surfaces of a solar cell article in the areas not covered by ribbons, which in turn causes deformation of the solar cell thus formed in such areas and damage to the solar cell during a later lamination process due to the deformation. Unexpectedly, heating apparatus 30, which heats ribbons and bus bars locally by using heating elements 33 during a soldering process, can reduce such damage to the solar cell while reducing energy consumption and improving soldering speed.

In some embodiments, heating apparatus 30 can heat the back surface of a photoelectrical conversion layer in a solar cell article 20 to a temperature similar to, or slightly lower than, that of the front surface of the photoelectrical conversion layer during a soldering process (which can be heated by soldering apparatus 10). For example, when heating apparatus 30 is made from a thermal conducting material having a relatively large thermal conductivity (e.g., copper, aluminum, or a metal alloy), heating elements 33 can locally heat areas covered by ribbons to a temperature from about 160° C. to about 180° C. and the thermal transfer in heating apparatus 30 can heat areas not covered by ribbons to a temperature of from about 120° C. to about 160° C.

Heating element 33 generally can have a length substantially the same as that of groove 32 so that heating element 33 can heat the entire groove. The cross-section of heating element 33 can have any suitable shape (e.g., a circular or rectangular shape). Heating element 33 can be made of any suitable thermal conductive material, such as a metal. In general, first channel 34 can have a shape and size substantially the same as those of heating element 33 such that heating element 33 can fit into first channel 34.

In general, a thermocouple 35 is connected to an electrical control system 37 and is configured to control heating of a groove 32 and the ribbons in the groove 32 within a certain temperature range. For example, a heating element 33 can also be connected to electrical control system 37, which can turn heating element 33 on or off in response to a signal from a thermocouple 35. During use, when a thermocouple 35 reaches a suitable temperature (e.g., 180° C. or 200° C.), it can send a signal to electrical control system 37, which can turn the corresponding heating element 35 off to stop heating. When the temperature of a thermocouple 35 is lowered to a certain temperature (e.g., 150° C.), it can send another signal to electrical control system 37, which turns the corresponding heating element 35 on to start heating. In general, thermocouples 35 and second channels 36 in which thermocouples 35 are disposed can have a size and shape substantially the same as those of heating elements 33 and first channels 34, respectively.

In general, soldering apparatus 10 and heating apparatus 30 can be used to attach ribbons on bus bars on the front and back surfaces of a solar cell as follows: A plurality of ribbons can be disposed on heating apparatus 30 such that each ribbon is disposed in a groove 32. A solar cell article 20 can then be disposed on heating apparatus 30 such that each of a plurality of bus bars on the back surface of a photoelectric conversion layer in solar cell article 20 is in contact with and covered by a ribbon in a groove 32. Another plurality of ribbons can then be disposed onto solar cell article 20 such that each ribbon covers one of a plurality of bus bars on the front surface of the photoelectric conversion layer. Heating plate 13 in soldering apparatus 10 can subsequently be lowered such that axially movable positioning shafts 14 contact and press ribbons against the bus bars on the front surface, and the bus bars on the back surface are pressed against the ribbons in grooves 32. Ribbons on the front surface can be soldered to the bus bars by directing hot air simultaneously to the ribbons (e.g., through first air exits 133) and to at least a portion of the photoelectric conversion layer not covered by the ribbons (e.g., through second air exits 135) to heat the ribbons and bus bars at a suitable temperature (e.g., from about 100° C. to about 300° C. such as about 180° C. or 200° C.) for a certain period of time (e.g., from about 0.5 second to about 5 seconds). Ribbons on the back surface can be soldered to the bus bars by heating grooves 32 using heating elements 33 at a suitable temperature (e.g., from about 100° C. to about 300° C. such as about 180° C. or 200° C.) for a certain period of time (e.g., from about 0.5 second to about 5 seconds). Ribbons can be soldered onto the front and back surfaces either simultaneously or sequentially. After the hot air and heating elements 33 are turned off, heating plate 13 can be lifted such that soldering apparatus 10 can be removed from the solar cell thus formed. In some embodiments, soldering apparatus 10 and heating apparatus 30 can be used to make more than one solar cell (e.g., from 2 to 60 solar cells) simultaneously or sequentially to form a solar module.

Other embodiments are within the scope of the following claims.

The invention claimed is:

1. A method for manufacturing a solar cell, comprising:
   disposing a plurality of ribbons onto a plurality of bus bars in an article containing a photoelectric conversion layer and the bus bars, the bus bars being disposed on the photoelectric conversion layer and each ribbon contacting a bus bar; and
   soldering the ribbons to the bus bars to form a solar cell, the soldering comprising directing hot air simultaneously to the ribbons and to at least a portion of the photoelectric conversion layer not covered by a ribbon through a plurality of air exits defined by a plate, each air exit is configured to directing hot air to a ribbon or a portion of the photoelectric conversion layer not covered by a ribbon;
   wherein each air exit for directing the hot air to the ribbon is in the plate and is configured to form an angle ranging from about 5° to about 60° with a vertical axis of the plate, and each air exit for directing the hot air to at least a portion of the photoelectric conversion layer not covered by the ribbon is in the plate and is generally parallel to the vertical axis of the plate.

2. The method of claim 1, wherein the hot air has a temperature ranging from about 100° C. to about 300° C.

3. The method of claim 1, wherein at least one air exit is a hole extending through the body of the plate.

4. The method of claim 1, wherein at least one air exit is a channel extending across a surface of the plate and extending through the body of the plate.

* * * * *